US010291178B2

(12) United States Patent
Wang et al.

(10) Patent No.: US 10,291,178 B2
(45) Date of Patent: May 14, 2019

(54) SOLAR TABLE

(71) Applicant: Yotrio Group Co., Ltd., Linhai (CN)

(72) Inventors: Yuanmin Wang, Linhai (CN); Kai Ji, Linhai (CN)

(73) Assignee: Yotrio Group Co., Ltd., Linhai, Zhejiang (CN)

(*) Notice: Subject to any disclaimer, the term of this patent is extended or adjusted under 35 U.S.C. 154(b) by 303 days.

(21) Appl. No.: 14/927,473

(22) Filed: Oct. 30, 2015

(65) Prior Publication Data

US 2017/0126174 A1 May 4, 2017
US 2018/0123509 A9 May 3, 2018

(30) Foreign Application Priority Data

Sep. 1, 2015 (CN) .................... 2015 2 0673693 U

(51) Int. Cl.
| | |
|---|---|
| *H02S 40/38* | (2014.01) |
| *H02S 40/34* | (2014.01) |
| *A47B 13/00* | (2006.01) |
| *A47B 13/08* | (2006.01) |
| *A47B 21/06* | (2006.01) |
| *F16B 12/44* | (2006.01) |
| *H01L 31/042* | (2014.01) |
| *H02J 7/02* | (2016.01) |
| *H02J 7/35* | (2006.01) |

(Continued)

(52) U.S. Cl.
CPC ............ *H02S 40/38* (2014.12); *A47B 13/003* (2013.01); *A47B 13/083* (2013.01); *A47B 21/06* (2013.01); *A47B 37/04* (2013.01); *F16B 12/44* (2013.01); *H01L 31/042* (2013.01); *H02J 7/025* (2013.01); *H02J 7/027* (2013.01); *H02J 7/355* (2013.01); *H02S 20/00* (2013.01); *H02S 40/34* (2014.12); *A47B 2021/066* (2013.01); *Y02E 10/50* (2013.01)

(58) Field of Classification Search
CPC ....... H02J 7/0042; H02J 7/0052; A47B 37/00; A47B 37/02; A47B 21/05; A47B 21/06; A47B 13/003; A47B 13/083; A47B 2021/066; A47B 37/04; H02S 30/10; H02S 30/12; H02S 40/10; H02S 40/32; H02S 40/38
USPC .................................................. 320/101, 108
See application file for complete search history.

(56) References Cited

U.S. PATENT DOCUMENTS

| | | | |
|---|---|---|---|
| 2004/0134324 A1* | 7/2004 | Sheddy | B23D 45/02 83/581 |
| 2005/0035075 A1* | 2/2005 | Walker | G09F 3/204 211/119.003 |

(Continued)

*Primary Examiner* — Nathaniel R Pelton
*Assistant Examiner* — Michael N Dibenedetto
(74) *Attorney, Agent, or Firm* — James Cai; SAC Attorneys LLP

(57) ABSTRACT

A solar table is disclosed to resolve the singleness of function according to the prior tables. The solar table includes a table frame, a table surface, a solar chip, a storage battery, a control chip and at least one digital module; wherein the table surface is set on the table frame and the solar chip is packaged in the table surface; the solar chip converts solar energy into electricity to charge the storage battery and the storage battery is electrically connected to the control chip; wherein each of the at least one digital module is electrically connected to the storage battery and the control chip.

12 Claims, 4 Drawing Sheets

(51) Int. Cl.
*A47B 37/04* (2006.01)
*H02S 20/00* (2014.01)

(56) References Cited

U.S. PATENT DOCUMENTS

| | | | | |
|---|---|---|---|---|
| 2009/0066140 A1* | 3/2009 | Berent | A47B 3/06 | 297/440.13 |
| 2010/0064945 A1* | 3/2010 | Sierenberg | A47B 37/04 | 108/50.02 |
| 2010/0308665 A1* | 12/2010 | Itkonen | H02J 5/005 | 307/104 |
| 2012/0187897 A1* | 7/2012 | Lenk | H01M 10/44 | 320/101 |
| 2013/0061783 A1* | 3/2013 | Bennie | A47B 21/06 | 108/25 |
| 2013/0257165 A1* | 10/2013 | Singh | H02J 17/00 | 307/98 |
| 2014/0009103 A1* | 1/2014 | Nita | H02J 7/355 | 320/101 |
| 2014/0217954 A1* | 8/2014 | Wilde | A47B 37/04 | 320/101 |
| 2015/0016116 A1* | 1/2015 | Huang | H05K 1/0274 | 362/296.01 |
| 2015/0141222 A1* | 5/2015 | DeLaCruz | A47C 9/002 | 482/142 |
| 2015/0216273 A1* | 8/2015 | Akin | A45B 25/00 | 135/16 |
| 2015/0256031 A1* | 9/2015 | Raghavan | H02J 13/0003 | 307/24 |
| 2015/0327739 A1* | 11/2015 | Edwards | A47K 17/028 | 4/254 |

* cited by examiner though many different kinds of tables such as liftable tables, foldable tables and drawable tables are derived, the functions of these tables are still very simple. As the fast development of science, consumers' dependence on new energy and digital technology is growing. More and more daily matters are preferably handled by using new energy and digital technology. Especially, digital technology has been widely used in people's normal life. Thus, a new kind of table that can utilize new energy and digital technology is highly needed.

SUMMARY OF THE INVENTION

In order to resolve the singleness of function according to the prior tables, a solar table sunshade is proposed according to embodiments of the present invention.

According to an embodiment of the present invention, a solar table includes a table frame, a table surface, a solar chip, a storage battery, a control chip and at least one digital module; wherein the table surface is set on the table frame and the solar chip is packaged in the table surface; the solar chip converts solar energy into electricity to charge the storage battery and the storage battery is electrically connected to the control chip;

wherein each of the at least one digital module is electrically connected to the storage battery and the control chip.

According to embodiments of the present invention, on the basis of retaining traditional table functions, the solar table can convert solar energy into electricity energy through the solar chip, and can store the electricity energy in the storage battery. Thus different digital functions can be achieved by obtaining energy supply from the storage battery. In addition, the different digital functions can be centrally controlled by the control chip, so that a highly intelligent service platform can be achieved.

BRIEF DESCRIPTION OF DRAWINGS

These and/or other aspects will become apparent and more readily appreciated from the following description of the embodiments, taken in conjunction with the accompanying drawings in which.

DETAILED DESCRIPTION OF THE INVENTION

The embodiments of the present invention are described more fully hereinafter with reference to the accompanying drawings, which form a part hereof, and which show, by way of illustration, specific exemplary embodiments by which the invention may be practiced. Under the principle and the novel feature of the present invention, any modifications of structures, methods or functions are all considered to be within the protection scope of the present invention.

In addition, the same reference signs or symbols may be repeatedly used in different embodiments for clarity and simplicity. However, these reference signs or symbols repeatedly used cannot be used to limit the relationships of structures in different embodiments.

Figure 1:
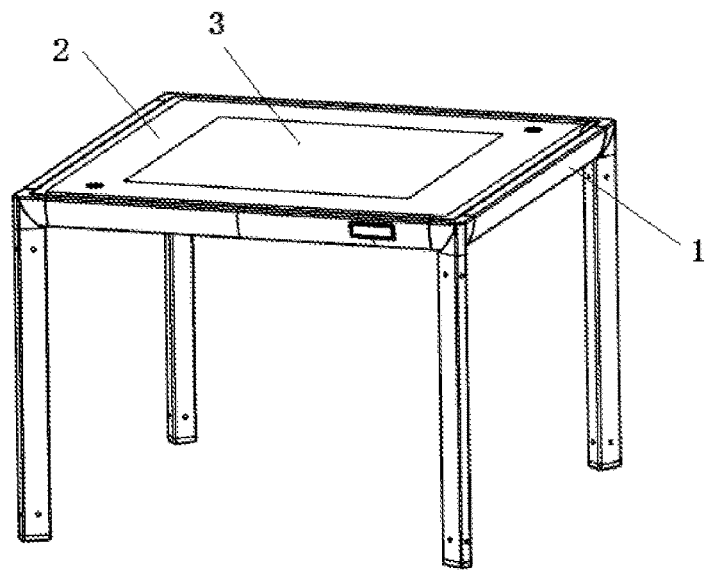
FIG. 1 illustrates a structure of a solar table according to an embodiment of the present invention.
Figure 2:
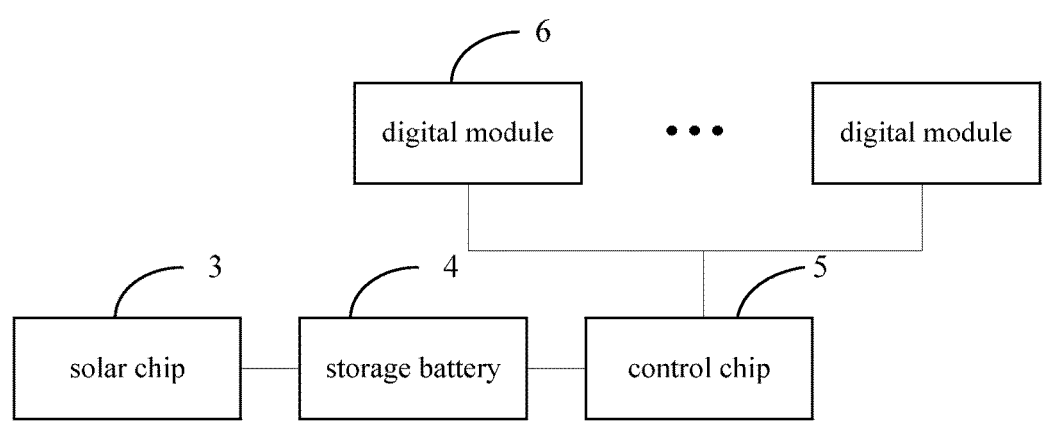
FIG. 2 illustrates a circuit structure of a solar table according to an embodiment of the present invention.

FIG. 1 illustrates a structure of a solar table according to an embodiment of the present invention. FIG. 2 illustrates a circuit structure of a solar table according to an embodiment of the present invention.

As shown in FIG. 1 and FIG. 2, the solar table includes: a table frame 1, a table surface 2, a solar chip 3, a storage battery 4, a control chip 5 and at least one digital module 6. The table surface 2 is set on the table frame 1 and the solar chip 3 is packaged in the table surface 2. The solar chip 3 converts solar energy into electricity to charge the storage battery 4 and the storage battery 4 is electrically connected to the control chip 5. In an embodiment of the present invention, the control chip 5 detects the power condition of the storage battery 4. Specifically, when the storage battery 4 is fully charged, the control chip 5 disconnects a charging circuit between the solar chip 3 and the storage battery 4; when the storage battery 4 is under a preset powerless condition (for example, less than 5% of the full power remains), the control chip 5 connects a charging circuit between the solar chip 3 and the storage battery 4.

Each of the at least one digital module 6 is electrically connected to the storage battery 4 and the control chip 5, so that it can get power from the storage battery 4 and complete the its digital function under the control of the control chip 5.

Those skilled in the art can understand that since the solar chip 3 and the storage battery 4 can guarantee energy supply, the number of the at least one digital module 6 may be increased or decreased according to the actual needs of consumers. When the control chip 5 adopts a standard design of an integrated chip, the at least one digital module 6 may include any finished digital components which is commercially available, so the functions of the solar table can be more inclusive. Accordingly, the number and type of the at least one digital module 6 are not limited thereto.

In an embodiment of the present invention, in order to ensure the solar chip 3 packaged in the table surface 2 can receive sunlight, the table surface 2 may be made of tempered glass or other transparent material. The table surface 2 may be silk-screen printed to meet aesthetic needs and may be 5 mm thick. When the table surface 2 is made of opaque material, the solar chip 3 must be exposed from the table surface 2 to receive sunlight. In this case, a hard transparent layer may be prepared on the surface of the solar chip 3 to meet the need of providing support force. In addition, the capacity of the storage battery 4 may be 7800 Ma/H, and the solar chip 3 may be made of thin film of single-crystal silicon. However, the material, model and parameters of the table surface 2, the storage battery 4 and the solar chip 3 are not limited thereto.

In addition, those skilled in the art can still understand that although the table surface 2 of the solar table shown in FIG. 1 is square, the table surface 2 may also adopt other shapes as long as the solar chip 3 packaged in the table surface 2 can convert solar energy to achieve digital functions. The shape of the table surface 2 is not limited thereto.

Figure 3:
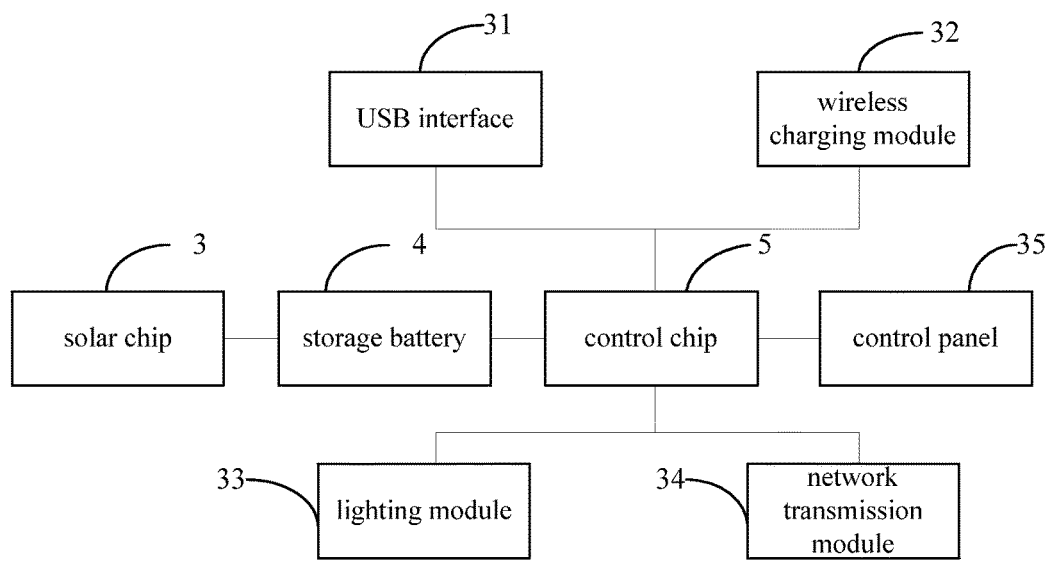
FIG. 3 illustrates a circuit structure of a solar table according to another embodiment of the present invention.

FIG. 3 illustrates a circuit structure of a solar table according to another embodiment of the present invention. As shown in FIG. 3, the at least one digital module 6 may include any or combination of following modules: a wireless charging module 32, a lighting module 33, a network transmission module 34 and a USB interface 31. The USB interface 31 can provide stable wire charging current for ordinary digital products of consumers. In a preferable embodiment, in order to facilitate the manual operation of the at least one digital module 6 for consumers, a control panel 35 may be further included in the solar table. The control panel 35 is electrically connected to the control chip 5, used for manually switching on/off the at least one digital module 6 or adjusting corresponding digital functions.

In an embodiment of the present invention, in order to facilitate consumers to visually monitor the operation status of the at least one digital module 6, a display module may be included in the control panel 35, used for displaying any or combination of the following status: a power condition of the storage battery 4, a signal condition of the network transmission module 34 and a charging status of the wireless charging module 32. Those skilled in the art can understand that the types of the status displayed by the display module may be increased if more digital modules 6 are included in the solar table.

In an embodiment of the present invention, the network transmission module 34 supports 4G, 3G and wifi signals. For example, when the network transmission module 34 supports the 4G signal, a specific chip module that can support 4G signal may be integrated in the network transmission module 34. Thus consumers can purchase a SIM card that contains 4G value-added service and insert the SIM card into the chip module to enjoy the 4G signal outdoors. As another example, when the network transmission module 34 supports the wifi signal, a wireless router may be integrated in the network transmission module 34. In a preferable embodiment, extra chips may be further used to strengthen the wifi signal to overcome the shortcoming of limited transmission distance of normal family wifi signal.

Figure 4:
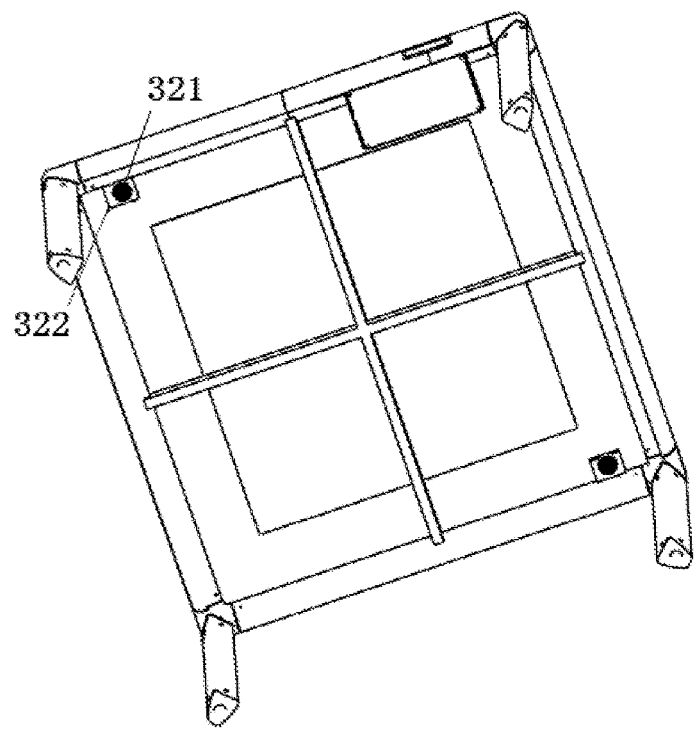
FIG. 4 illustrates a structure of a solar table according to an embodiment of the present invention.

In an embodiment of the present invention, the wireless charging module 32 includes two charging transmitter elements 321 and two wireless charging support tubes 322. The charging principle of the charging transmitter element 321 is using inductive coupling technology, which can provide stable charging current for digital products that have receiving ports for wireless charging. The two charging transmitter elements 321 are fixed under the table surface by the two wireless charging support tubes 322. The two wireless charging support tubes 322 may be fixed on the table surface 2 by screws. As shown in FIG. 1 and FIG. 4, when the table surface 2 of the solar table is square, the two charging transmitter elements 321 may be respectively set at two across corners of the solar table by the two wireless charging support tubes 322. Two silk screen logos may be printed at the positions on the table surface 2 corresponding to the two charging transmitter elements 321. Thus when a consumer put a digital product that has a receiving port for wireless charging on the silk screen logo, the digital product will be wireless charged by the charging transmitter element 321.

In an embodiment of the present invention, the wireless charging module 32 may further include two indicator lights and two alarms. Each charging transmitter element 321 is electrically connected to an indicator light and an alarm. Thus, when there is an interference object on the charging transmitter element 321, the indicator light glows with red color and the alarm makes an alarm tone; when there is a digital product that has a receiving port for wireless charging on the charging transmitter element 321, the indicator light glows with blue color and the alarm makes a preset tone to indicate that the digital product can be wireless charged.

The solar table described above has a separate power supply system and can achieve an integrated working platform. Since the digital modules 6 integrated in the solar table are all modularized, other digital modules 6 may be further included in the product design of the solar table, such as infrared, bluetooth, audio, and other electronic functional components. In a preferable embodiment, in order to achieve a more diversified platform for integrating modules and providing excellent service, a cloud platform of software service may be built in the control chip 5, which can push and receive the information specified by consumers (such as health tips, weather condition etc.) through the network transmission module 34, and display the information through the display module in the control panel 35. Furthermore, a cloud server may be further established to achieve a more intelligent high-quality service platform.

The above embodiments are used for describing the digital functions that can be achieved by the solar table of the present invention. The following embodiments are used for describing the structure of the table frame 1 in detail.

Figure 5:
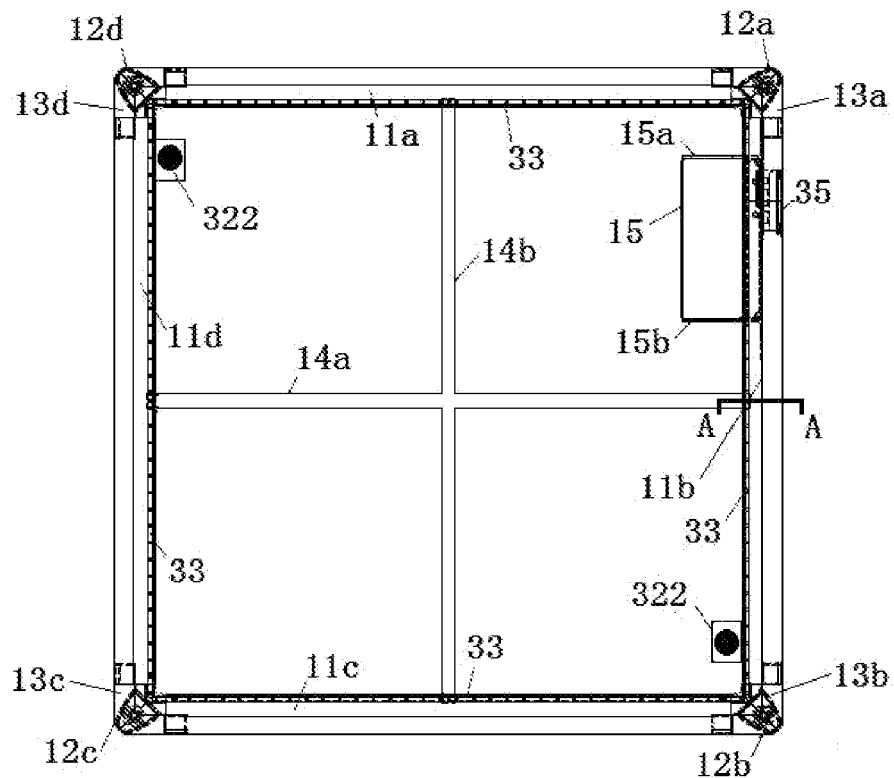
FIG. 5 is a bottom view of a solar table according to an embodiment of the present invention.
Figure 6:
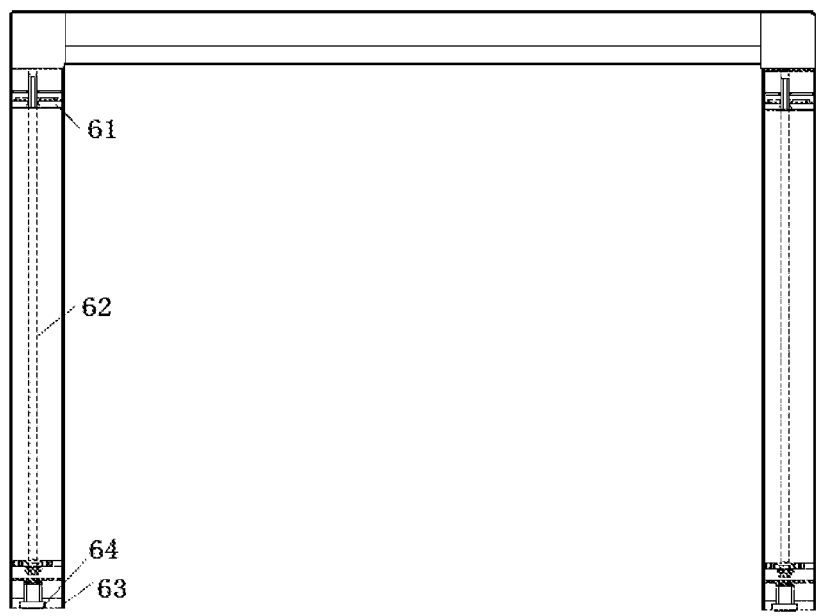
FIG. 6 is a front view of a solar table according to an embodiment of the present invention.

FIG. 5 is a bottom view of a solar table according to an embodiment of the present invention. FIG. 6 is a front view of a solar table according to an embodiment of the present invention. As shown in FIG. 5 and FIG. 6, the table frame 1 of the solar table includes: a frame side 11a, a frame side 11b, a frame side 11c, a frame side 11d, a frame leg 12a, a frame leg 12b, a frame leg 12c, a frame leg 12d, a frame corner 13a, a frame corner 13b, a frame corner 13c and a frame corner 13d.

The frame side 11a, frame side 11b, frame side 11c and frame side 11d are interconnected end to end to form a square table rim. The frame side 11a is connected to the frame side 11b through the frame corner 13a; the frame side 11b is connected to the frame side 11c through the frame corner 13b; the frame side 11c is connected to the frame side 11d through the frame corner 13c; and the frame side 11d is connected to the frame side 11a through the frame corner 13d. Meantime, the frame corner 13a, frame corner 13b, frame corner 13c and frame corner 13d are respectively connected to the frame leg 12a, frame leg 12b, frame leg 12c and frame leg 12d.

In an embodiment of the present invention, in order to enhance the stability of the table rim assembled from the frame sides, a support tube 14*a* and a support tube 14*b* are connected to form a cross shape and set under the table surface 2. Each end of the cross shape is used for sustaining the centre part of a frame side.

In an embodiment of the present invention, as shown in FIG. 6, a specific connection manner between the frame leg and the frame corner may be as follows: one plug piece 61 is welded onto a top surface of each frame leg, and then the plug piece 61 is inserted into a corresponding frame corner and fixed through a threaded rod 62. In a preferable embodiment, a mat 63 is set under a bottom surface of each frame leg, and an adjusting knob 64 is set in the mat 63. The ground clearance of each mat 63 can be adjusted by rotating the adjusting knob 64 to keep the balance of the solar table.

In an embodiment of the present invention, a wiring concentrator box 15 may be further set on the frame side 11*b* and fixed on the frame side 11*b* through a lug 16*a* and a lug 16*b*. Thus, the control chip 5 and the storage battery 4 can be set inside the wiring concentrator box 15. When a control panel 35 is included in the solar table, the control panel 35 may be set on the outer surface of the frame side 11*b* corresponding to the position of the wiring concentrator box 15. Those skilled in the art can understand that the wiring concentrator box 15 may be set on any frame side, which is not limited thereto.

Figure 7:
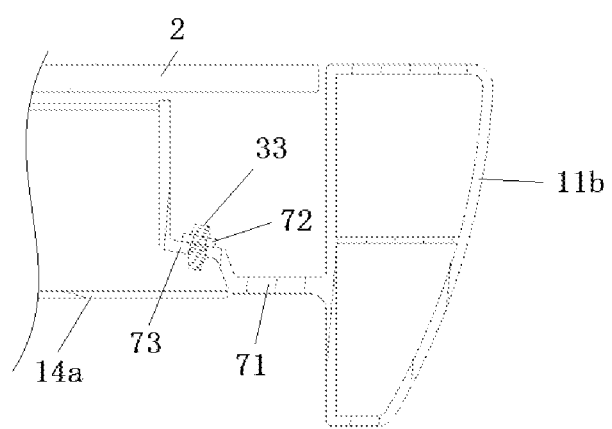
FIG. 7 is a cross section view along the line A-A in FIG. 5.

FIG. 7 is a cross section view along the line A-A in FIG. 5. As shown in FIG. 7, each frame side includes a covered trough 71 and the frame side 11*b* has wiring through holes. Thus, the solar chip 3, the at least one digital module 6, the storage battery 4 and the control chip 5 may be interconnected by wiring in the covered troughs 71 and the wiring concentrator box 15 through the wiring through holes. Those skilled in the art can understand that when the wiring concentrator box 15 is set on another frame side, the through holes are set on another frame side. At least one of the frame sides includes the through holes.

In an embodiment of the present invention, there is a gap between the square table rim and the table surface 2. A slope is constructed in the covered trough 71 and a drainage hole is set at the bottom of the slope. In this case, rain water or cleaning water may leak into the covered troughs 71 through the gap, and flow to the drainage hole along the slope.

In an embodiment of the present invention, as shown in FIG. 5 and FIG. 7, the lighting module 33 may include LED light bars, and the LED light bars are fixed in the covered troughs 71 via adhesive nails 72. Thus the LED light bars form a LED square rim, and the LED square rim is set in a square groove consisting of the four covered troughs 71. The light emitted by the LED light bars can shine through the table surface 2 to provide illumination at night or create romantic atmosphere.

In an embodiment of the present invention, as shown in FIG. 7, a step 73 may be constructed in each covered trough 71 and the LED light bar may be fixed on the top surface of the step via adhesive nails 72. Thus the LED light bars can be protected from being wetted by the rain water or cleaning water in the covered troughs 71. In a preferable embodiment, the LED light bars may be made of water-blocking material.

In an embodiment of the present invention, to meet the aesthetic needs, all the components of the table frame 1 are the polished and painted.

Those skilled in the art can understand that the present invention is not limited to the details described in above embodiments. Under the principle and the novel feature of the present invention, the present invention may also be realized in other embodiments. Therefore, all the embodiments described above should be considered as preferable examples rather than limitations of the technical scheme of the present invention, any modifications under the principle and the novel feature of the present invention are all considered to be within the protection scope of the present invention. Furthermore, the reference signs or symbols used cannot be used for limiting the protection scope of the present invention. Those skilled in the art can also understand that although the present invention is described with embodiments for clarity, each embodiment may include more than one technical scheme. The embodiments described in the specification should be considered as a whole. Those skilled in the art may obtain other new embodiments by combing the technical schemes described in the embodiments of the specification.

The invention claimed is:

1. A solar table, comprising:
   a table frame;
   a table surface;
   a solar chip;
   a storage battery;
   a control chip;
   a table rim, the table rim being defined by four frame sides, the table rim defining a rim top side and a periphery of the solar table;
   said table surface being supported by the four frame sides, the table surface being flush with the rim top side, the rim and the table surface defining a gap therein between, the gap being configured so that a water on the table surface will flow through the gap between the table surface and the table rim;
   a trough defined by the frame sides and disposed about the periphery of the solar table, the trough being disposed below the gap, the table surface covering the trough to define a covered trough, the covered trough being configured to receive the water that penetrates the gap from the table surface top side, the covered trough defining a trough bottom, the trough bottom defining a slope and a drainage hole, the slope being configured to cause the water that penetrates the gap to flow within the covered trough to the drainage hole;
   a step located inside the covered trough and defined by the trough bottom, the step being configured to be above a surface of the water in the covered trough when the water penetrates the gap and enters the covered trough;
   said solar chip being disposed within the table surface, the solar chip being configured to generate electricity when exposed to solar radiation passing through the table surface, the solar chip being configured to charge a storage battery;
   an LED light bar attached to the step inside the covered trough, the LED light bar being configured to selectably illuminate an underside of the table surface that covers the covered trough, the LED light bar being selectably powered by the storage battery; and
   a digital module;
   said digital module comprising:
      a wireless charging module;
      a lighting module;
      a network transmission module; and
      a USB interface;
   wherein the table surface is set on the table frame and the solar chip is packaged in the table surface, and wherein the solar chip converts solar energy into electricity to charge the storage battery and the storage battery is electrically connected to the control chip;

wherein the digital module is electrically connected to the control chip; and wherein said wireless charging module comprises two charging transmitter elements and two wireless charging support tubes, wherein the two charging transmitter elements are fixed under the table surface by the two wireless charging support tubes.

2. The solar table of claim 1, wherein the control chip detects a power condition of the storage battery; wherein when the storage battery is fully charged, the control chip disconnects a charging circuit between the solar chip and the storage battery; when the storage battery is under a preset powerless condition, the control chip connects the charging circuit between the solar chip and the storage battery.

3. The solar table of claim 1, further comprising a control panel; wherein the control panel is electrically connected to the control chip, used for manually switching on/off the digital module or adjusting corresponding digital functions.

4. The solar table of claim 3, wherein the control panel comprises a display module, adapted for displaying one or more of the following status: a power condition of the storage battery, a signal condition of the network transmission module and a charging status of the wireless charging module.

5. The solar table of claim 1, wherein the network transmission module supports 4G, 3G and WiFi signals.

6. The solar table of claim 1, wherein the wireless charging module further comprises two indicator lights and two alarms; wherein each charging transmitter element is electrically connected to an indicator light and an alarm; wherein when there is an interference object on the charging transmitter element, the indicator light glows with red color and the alarm makes an alarm tone; when there is a digital product that has a receiving port for wireless charging on the charging transmitter element, the indicator light glows with blue color and the alarm makes a preset tone to indicate that the digital product is wireless charged.

7. The solar table of claim 1, wherein the table frame comprises: said four frame sides, four frame legs and four frame corners; wherein the four frame sides are interconnected end to end to form said table rim; each two adjacent frame sides are interconnected through one frame corner; each frame corner is connected to one frame leg.

8. The solar table of claim 7, wherein the table frame further comprises two support tubes; wherein the two support tubes are interconnected to form a cross shape and set under the table surface; each end of the cross shape is used for sustaining the center part of one frame side.

9. The solar table of claim 7, wherein the table frame further comprises a wiring concentrator box; wherein the wiring concentrator box is set on anyone of the four frame sides; the control chip and the storage battery are set inside the wiring concentrator box.

10. The solar table of claim 1, wherein the LED light bar is made of water-blocking material.

11. The solar table of claim 7, wherein one plug piece is welded onto a top surface of each frame leg, and the plug piece is inserted into a corresponding frame corner and fixed through a threaded rod.

12. The solar table of claim 7, wherein a mat is set under a bottom surface of each frame leg, and an adjusting knob is set in the mat; wherein the ground clearance of each mat is adjusted by rotating the adjusting knob.

* * * * *